United States Patent [19]

Smith, III

[11] Patent Number: 4,728,814

[45] Date of Patent: Mar. 1, 1988

[54] TRANSISTOR INVERSE MODE IMPULSE GENERATOR

[75] Inventor: George E. Smith, III, Wappingers Falls, N.Y.

[73] Assignee: International Business Machines Corporation, Armonk, N.Y.

[21] Appl. No.: 915,467

[22] Filed: Oct. 6, 1986

[51] Int. Cl.$^4$ .............. H03K 4/00; H03K 3/017; H03K 5/01; H03K 3/26

[52] U.S. Cl. .............. 307/260; 307/265; 307/268; 307/299.1

[58] Field of Search ............ 307/254, 454, 457, 458, 307/255, 260, 443, 270, 262, 263, 265, 268, 273, 299 R

[56] References Cited

U.S. PATENT DOCUMENTS

| | | | |
|---|---|---|---|
| 3,083,303 | 3/1963 | Knowles | 307/457 |
| 3,183,366 | 5/1985 | Brode | 307/454 |
| 3,231,765 | 1/1966 | Martin | 307/265 |
| 3,319,086 | 5/1967 | Yee | 307/268 |
| 3,394,268 | 7/1968 | Murphy | 307/457 |
| 3,824,408 | 7/1974 | Brunel | 307/457 |
| 3,978,349 | 8/1976 | Kumbatovic | 307/255 |
| 4,081,698 | 3/1986 | Minakuchi | 307/261 |
| 4,370,569 | 1/1983 | Hunsinger | 307/266 |
| 4,394,588 | 7/1983 | Gaudenzi | 307/443 |
| 4,529,894 | 7/1985 | Chan | 307/454 |

Primary Examiner—Stanley D. Miller
Assistant Examiner—Trong Q. Phan
Attorney, Agent, or Firm—William T. Ellis

[57] ABSTRACT

An impulse generator for detecting an edge of an input pulse. The impulse generator comprises a first and second transistors connected to turn on at the occurrence of a signal pulse on an input line, with the second transistor connected to operate in its inverse mode so that it has a longer turn-on time. The second transistor is connected in such a manner as to draw current away from the base of the first transistor when the second transistor turns on, thereby causing an impulse to be generated at the output terminal of the first transistor, regardless of the width of the input pulse.

21 Claims, 1 Drawing Figure

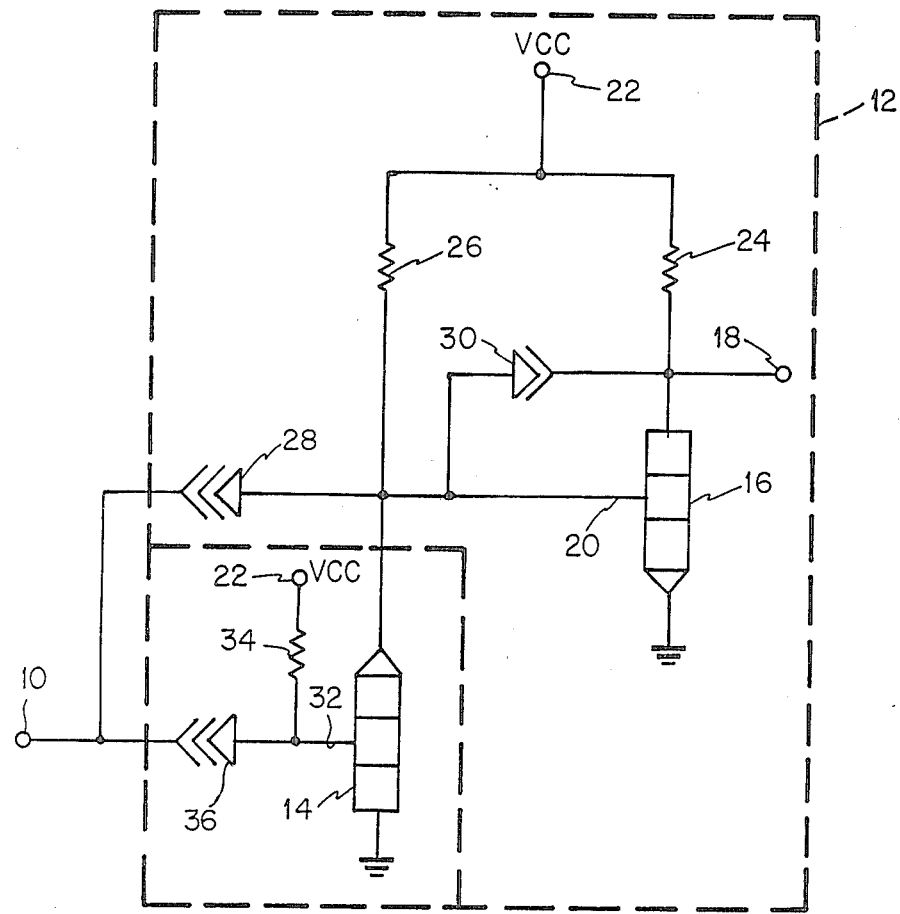

TRANSISTOR INVERSE MODE IMPULSE GENERATOR

BACKGROUND OF THE INVENTION

The present invention relates generally to impulse generators, and more particularly to an impulse generator composed of a minimum number of transistors.

An impulse generated from the edge of another signal is required for a variety of applications in the electronics industry. Such edge detecting impulse generators are commonly required in logic applications to generate clocking signals, triggering signals, and the like. Standard edge detecting and impulse generating schemes utilize a delay chain of many gates. For example, U.S. Pat. No. 4,370,569 discloses an edge detector utilizing a chain of three transistors in combination with an output gate transistor. However, such a circuit requires substantial IC area and power. This is a distinct disadvantage in high frequency applications wherein such large IC areas would tend to hold more stray capacitance which degrades high frequency signal propagation.

The invention as claimed is intended to remedy the above-described drawbacks of the prior art.

An advantage offered by the present invention is that an impulse generator is fabricated with a minimum of transistors in a significantly reduced IC area and with significantly reduced power dissipation. The impulse generated in the invention has a predetermined width, regardless of the width pulse which triggered its generation.

SUMMARY OF THE INVENTION

Briefly, the present invention is an impulse generator for generating an impulse at the edge of an input signal, comprising:

an input line for receiving an input signal;

a gate circuit including a gate transistor with an output terminal and a control input for turning the gate transistor on and off, with the control input being connected to turn on at the occurrence of a pulse on the input line; and a second transistor connected to operate in its inverse mode so that it has a longer turn-on time than the gate transistor. The second transistor has a control input connected to turn on the second transistor at the occurrence of a pulse on the input line, and is connected to turn the gate transistor off when the second transistor turns on, to thereby cause an impulse to be generated at the output terminal of the gate transistor, regardless of the width of the input pulse.

In one embodiment, the gate transistor may comprise a first current-controlled transistor, and the second transistor may comprise a second current-controlled transistor. In this embodiment, the second transistor is connected to draw current away from the control input of the first transistor to thereby turn off the first transistor when the second transistor turns on. This embodiment may further include first means for providing current to the control input of the first transistor upon the occurrence of a pulse on the input line, and second means for providing current to the control input of the second transistor upon the occurrence of a pulse on the input line.

In a preferred embodiment, the first and second transistors may each be bipolar transistors having an emitter, a collector, and a base as the control input. In this configuration, the emitter of the inverse mode second transistor is connected to the base of the first transistor to draw current from the first transistor base when the second transistor turns on, to thereby turn the first transistor off.

BRIEF DESCRIPTION OF THE DRAWINGS

The FIGURE is a schematic diagram of one embodiment of the present invention.

DETAILED DESCRIPTION OF THE PREFERRED EMBODIMENT

Referring now to the FIGURE, there is shown one embodiment of the present invention. This embodiment includes an input line 10 for receiving an input signal pulse, in combination with a gate circuit 12 and a second transistor 14. The gate circuit 12 includes a gate transistor 16 with an output terminal 18 and a control input 20 for turning the gate transistor on and off. The control input 20 is connected to turn on the gate transistor 16 at the occurrence of a pulse on the input line 10. The second transistor 14 is connected to operate in its inverse mode so that it has a longer turn-on time than the gate transistor 16. This second transistor 14 has a control input 32 connected to turn on the second transistor 14 at the occurrence of a pulse on the input line 10. The second transistor 14 is connected to turn the gate transistor 16 off when the second transistor turns on, to thereby cause an impulse to be generated at the output terminal 18 of the gate transistor 16, regardless of the width of the input pulse.

With respect to the inverse mode connection for transistor 14, it is well known that in a normally connected transistor, the emitter acts as a source of electrons for the device, while the collector acts to collect those electrons. To facilitate this operation, the emitter is designed, by way of example, to have a high doping profile in the range of $10^{19}$–$10^{20}$ atoms/cm$^2$, so that it may act as an electron source, while the collector is designed to have a low doping profile in the range of $10^{14}$–$10^{15}$ atoms/cm$^2$. Likewise, to facilitate the electron collection operation, the collector is provided with an area which is typically at least 100 times larger than the emitter area. Such a transistor is optimized for electron flow from the emitter to the collector. By connecting such a transistor to operate in the inverse mode so that electrons flow from the collector to the emitter, a substantially longer turn-on time is incurred. This turn-on time depends on the level of doping and the area for the collector and emitter regions and can clearly be tailored for a desired application.

It should be noted that the present invention may be implemented in a variety of different circuit configurations. By way of example, and not by way of limitation, the gate circuit 12 is implemented in the FIGURE in a current-controlled transistor configuration. This configuration includes a voltage supply 22, a first resistance means 24 connected between the voltage supply 22 and the collector output terminal 18 of the gate transistor 16, a third resistance means 26 connected between the voltage supply 22 and the base terminal 20 of the gate impedance 16, and second means 28 for providing a low impedance current path from the voltage supply 22 through the third reistance means 26 to the input line 10, if, and only if, no input pulse is present at the input line 10. Typically, this second means 28 for providing a low impedance current path may be implemented simply by a low barrier Schottky diode. An anti-saturation clamp diode 30 is usually also connected across the base 20 and the collector 18 of the gate transistor 16 in order to prevent the base-collector junction of the gate transistor 16 from turning on. This diode 30, shown in the FIGURE as a high barrier Schottky diode, prevents a charge storage at the base-collector junction which would have to be removed before the transistor could be turned off. The emitter of the gate transistor 16 is connected to ground potential.

The above-described configuration including the two resistance means 24 and 26, in combination with the diode 28 and the transistor 16, form what is commonly referred to as a DTL logic gate. This logic gate 12 operates as follows. When no input voltage pulse is present on the input line 10, then a current path is provided from the voltage supply 22 through the third resistance means 26 and through the diode 28 to the input line 10. The low impedance path through the diode 28 prevents any current from flowing to the base 20 of the gate transistor 16. Alternatively, the voltage drop across the third resistance means 26 is sufficient to provide a relatively low voltage at the base terminal 20, thereby preventing the gate transistor from turning on. Because the gate transistor 16 is not conducting, no current is being drawn through the first resistance means 24. Thus, the collector output terminal 18 has a voltage approaching the supply voltage VCC of the voltage supply 22. Accordingly, the output terminal 18 is at an UP voltage. When a positive going voltage pulse is applied to the input line 10, the diode 28 is biased into non-conduction. Accordingly, the current through the third resistance means 26 switches and flows to the base 20 of the gate transistor 16, thereby turning the transistor 16 on. When the gate transistor 16 turns on, it draws current from the voltage supply 22 through the first resistance means 24 and through the transistor 16 to ground. The voltage drop caused by the current flow through the first resistance means 24 generates a DOWN voltage at the output terminal 18.

It is desired in accordance with the present invention, to generate an impulse signal in response to an edge of the input voltage pulse applied on the input line 10. This impulse signal at the output terminal 18 should have a predetermined width which does not depend on the width of the pulse at the input line 10. This impulse signal generation is accomplished by the connection of the inverse mode second transistor 14 in such a fashion that when it turns on, it causes the gate transistor 16 to turn off. By then connecting the control input of this second transistor 14 to the input line 10 in parallel with the connection to the gate transistor 16, this will cause the gate transistor 16 to turn on first, followed shortly by the turning on of the longer turn-on inverse mode second transistor 14. Thus, the output terminal 18 will initially go to a DOWN voltage when the gate transistor 16 turns on, and then rise to a UP voltage when the inverse mode second transistor 14 turns on and causes the gate transistor 16 to turn off.

The circuitry for connecting the inverse mode second transistor 14 to control the operation of the gate transistor 16 may take a variety of configurations. In the example embodiment shown in the FIGURE, the circuitry for the second transistor 14 utilizes a current-controlled configuration. In this configuration, a second resistance means 34 is connected between the voltage supply 22 and the base terminal 32 of the transistor 14. Additionally, first means 36 are provided for providing a low impedance current path from the voltage supply 22, through the second resistance means 34, to the input line 10, if, and only if, no input pulse is present at the input line 10. This first means 36 thus ensures that the second transistor 14 turns on only when an input pulse is present on the input line 10. In a preferred embodiment, this first means may again be implemented by a low barrier Schottky Diode. The second transistor 14 in this configuration is disposed with its emitter connected to the base terminal 20 of the gate transistor 16, and with its collector connected to ground potential. This connection causes the second transistor to draw current away from the base 20 of the first transistor 16 when the second transistor 14 turns on, thereby turning off the gate transistor 16.

In operation, when a high voltage from an input pulse on the input line 10 is applied to the diodes 28 and 36, this voltage biases these diodes into non-conduction. Accordingly, current flow from the voltage supply 22 through the third resistance means 26 switches and flows to the base terminal of the gate transistor 16. Likewise, current flowing from the voltage supply 22 through the second resistance means 34 is switched to flow to the base terminal 32 of the second transistor 14. The gate transistor 16 immediately turns on, thereby drawing current from the voltage supply 22, through the first resistance means 24 and through the gate transistor 16 to ground. The voltage drop across the first resistance means 24 causes a DOWN voltage at the output terminal 18. Because the second transistor 14 is connected in its inverse mode, it turns on slowly and requires approximately 5-6 nano seconds to start turning on fully. Once the second transistor 14 is on, it draws current away from the base terminal 20 of the gate transistor and down through the second transistor 14 to ground potential. This switching of the current away from the base 20 of the gate transistor 16 causes the gate transistor 16 to turn off immediately, thereby causing an UP voltage at the output terminal 18. It can be seen that the width of the impulse generated at the output terminal 18 is approximately equal to the turn-on time of the gate transistor 16 subtracted from the turn-on time of the inverse mode second transistor 14. Accordingly, it can be seen that an impulse has been generated at the input pulse edge which is independent of the input pulse width.

As is well known in the art, the above-described circuit can be utilized to generate an impulse at either the leading or the following edge of an input pulse. Additionally, it is possible to generate a plurality of impulses simply by utilizing cascaded sections of parallel connected impulse circuits of the present invention. In this regard, a parallel section would simply comprise a first and a second impulse circuits connected in parallel, with an inverting circuit disposed in one of the parallel lines to thereby cause an impulse to be generated at the rising edge of an input pulse and at the falling edge of the input pulse. By then cascading these parallel sections of impulse generating circuits, it is possible to generate a desired series of pulses.

It should be noted that the present circuit effects an impulse generation utilizing only two transistors. This two-transistor circuit replaces an entire delay chain consisting of many gates, resulting in a substantial savings of power and IC area.

It should also be noted that the present impulse generating circuit can be formed simply by personalizing a standard multi-cell in a gate array.

While the present invention has been particularly shown and described with reference to preferred embodiments therefor, it will be understood by those skilled in the art that the foregoing and other changes in form and detail may be made therein without departing from the spirit and scope of the present invention.

I claim:

1. an impulse generator for generating an impulse at an edge of an input pulse, comprising:
    an input line for receiving an input pulse;
    a gate circuit including a gate transistor with an output terminal, and with a control input terminal for turning said gate transistor on and off, said control input terminal being connected to said input line to turn on said gate transistor at the occurrence of one edge of a pulse on said input line; and
    a second transistor connected to operate in its inverse mode so that it has a longer turn-on time than said gate transistor, said second transistor having a control input terminal connected to said input line to turn on said second transistor at the occurrence of said one edge of said pulse on said input line, said second transistor being connected to turn said gate transistor off when said second transistor turns on, to thereby cause an impulse to be generated at the output terminal of said gate transistor, regardless of the width of said input pulse.

2. An impulse generator as defined in claim 1, wherein said gate transistor and said second transistor are bipolar transistors, each having a collector and an emitter, and with said control input terminal being the respective transistor bases.

3. An impulse generator as defined in claim 2, wherein said gate circuit includes:
    a voltage supply; and
    first resistance means connected between said voltage supply and the collector of said gate transistor; and
    wherein said output terminal is connected to said collector of said gate transistor.

4. An impulse generator as defined in claim 3, comprising:
    second resistance means connected between said voltage supply and the base of said second transistor; and
    first means for providing a low impedance current path from said voltage supply through said second resistance means to said input line, if and only if, no input pulse is present at said input line, so that said second transistor turns on only when an input pulse is present on said input line.

5. An impulse generator as defined in claim 4, wherein said gate circuit comprises:
    a third resistance means connected between said voltage supply at one end and the base of said gate transistor and the emitter of said second transistor at its other end; and
    second means for providing a low impedance current path from said voltage supply through said third resistance means to said input line, if and only if, no input pulse is present at said input line, so that said gate transistor turns on only when an input pulse is present on said input line.

6. An impulse generator for generating an impulse at the edge of an input signal, comprising:
    an input line;
    a first current-controlled transistor including an output terminal, and a control input terminal connected to said input line to turn-on said first current-controlled transistor at the occurrence of a signal pulse on said input line; and
    a second current-controlled transistor connected to operate in its inverse mode so that it has a longer turn-on time than said first current-controlled transistor, said second current-controlled transistor having a control input terminal connected to said input line to turn on said second current-controlled transistor at the occurrence of a pulse on said input line, said second current-controlled transistor being connected to the control input terminal of said first current-controlled transistor to thereby turn off said first current-controlled transistor when said second current-controlled transistor turns on, to thereby cause an impulse to be generated at the output terminal of said first current-controlled transistor, regardless of the width of said input pulse.

7. An impulse generator as defined in claim 6, comprising
    first means for providing current to said control input terminal of said first current-controlled transistor upon the occurrence of a pulse on said input line; and
    second means for providing current to said control input terminal of said second current-controlled transistor upon the occurrence of a pulse on said input line.

8. An impulse generator as defined in claim 7, wherein said first and second current-controlled transistors each has an emitter, a collector, and a base as said control input terminal; and
    wherein the emitter of said second current-controlled transistor is connected to draw current from said first current-controlled transistor base when said second current-controlled transistor turns on, to thereby turn said first current-controlled transistor off.

9. An impulse generator as defined in claim 1, wherein said gate transistor and said second current-controlled transistor are both of the same conductivity type.

10. An impulse generator as defined in claim 1, wherein said second transistor comprises a first section having a first doping level and connected to emit negative-defined current; and a second section having a second doping level which is higher than said first doping level by at least a factor of ten, but of the same conductivity type, and disposed to collect negative-defined current from said first section.

11. An impulse generator as defined in claim 5, wherein said gate transistor and said second transistor are both of the same conductivity type.

12. An impulse generator as defined in claim 5, wherein said emitter of said second transistor has a first doping level and first area and is connected to the base of said gate transistor, and said collector of said second transistor has a second doping level which is lower than said first doping level and a second area which is larger than said first area, and is connected to a reference potential which is lower than the potential of said gate transistor base.

13. An impulse generator as defined in claim 6, wherein said first and second current-controlled transistors are bipolar transistors, each having a base, an emitter with a first doping level and a first area, and a collector with a second doping level which is lower than said first doping level and a second area which is greater than said first area, with said emitter of said second current-controlled transistor connected to collect negative-defined current from said collector of said second current-controlled transistor.

14. An impulse generator as defined in claim 6, wherein said first and second current-controlled transistors are both of the same conductivity type.

15. An impulse generator as defined in claim 8, wherein said first and second current-controlled transistors are both of the same conductivity type.

16. An impulse generator for generating an impulse at the edge of an input pulse, comprising:
   first means connected to an output terminal and an input terminal and including a gate transistor with a first turn-on time, said first means for changing the output level on said output terminal to a first level upon the occurrence of one edge of a pulse on said input line; and
   second means connected to said first means including a second transistor with a longer turn-on time than said first turn-on time, said second means for changing said first level on said output terminal to a second level which is different from said first level automatically after a time delay from the occurrence of the first level, said time delay being approximately equivalent to the difference between said second transistor turn-on time and said gate transistor turn-on time.

17. An impulse generator as defined in claim 16, wherein said first and second means include means for causing said gate transistor and said second transistor to both begin to turn-on upon the occurrence of said one edge of said input pulse.

18. An impulse generator as defined in claim 17, wherein said gate transistor and said second transistor are both of the same conductivity type.

19. An impulse generator as defined in claim 17, wherein said second transistor is designed to have a faster turn-on time for current flow in a first direction relative to a second direction therethrough and said second transistor is connected to operate in its inverse mode upon the occurrence of said one edge of said input pulse so that current flows in said second direction therethrough.

20. An impulse generator as defined in claim 19, wherein said gate transistor and said second transistor are bipolar transistors, each having a collector, emitter, and a base, and said second transistor is designed for current flow from the collector to the emitter, as compared to current flow from the emitter to the collector, and wherein said first means includes means for making said output level dependent upon the current flow through said gate transistor.

21. An impulse generator as defined in claim 20, wherein said second means includes means for causing said second transistor, once it turns-on, to draw current away from the base of said gate transistor to thereby turn off said gate transistor and the current flow therethrough.

* * * * *